(12) United States Patent
Yajima

(10) Patent No.: US 8,648,663 B2
(45) Date of Patent: Feb. 11, 2014

(54) OSCILLATOR HAVING A PLURALITY OF SWITCHABLE MEMS VIBRATORS

(75) Inventor: Aritsugu Yajima, Matsumoto (JP)

(73) Assignee: Seiko Epson Corporation (JP)

( * ) Notice: Subject to any disclaimer, the term of this patent is extended or adjusted under 35 U.S.C. 154(b) by 13 days.

(21) Appl. No.: 13/444,144

(22) Filed: Apr. 11, 2012

(65) Prior Publication Data

US 2012/0262243 A1 Oct. 18, 2012

(30) Foreign Application Priority Data

Apr. 13, 2011 (JP) ................. 2011-088915

(51) Int. Cl.
*H03B 5/30* (2006.01)
*H01L 41/00* (2013.01)
*H03H 9/205* (2006.01)

(52) U.S. Cl.
USPC .......... 331/162; 331/49; 331/56; 331/154; 331/179; 310/342; 333/189; 333/197

(58) Field of Classification Search
USPC ............... 310/342; 327/298; 331/46, 49, 56, 331/116 FE, 116 M, 116 R, 154, 158, 162, 331/179; 333/189, 197–199
See application file for complete search history.

(56) References Cited

U.S. PATENT DOCUMENTS

| | | | | |
|---|---|---|---|---|
| 3,100,886 A | * | 8/1963 | Marks | 367/137 |
| 3,614,667 A | * | 10/1971 | Fletcher | 332/106 |
| 5,481,227 A | * | 1/1996 | Komori et al. | 331/2 |
| 6,204,737 B1 | * | 3/2001 | Ella | 333/187 |
| 6,809,604 B2 | * | 10/2004 | Kawakubo et al. | 331/107 A |
| 6,933,794 B2 | * | 8/2005 | Ogiso | 331/107 A |
| 6,936,491 B2 | | 8/2005 | Partridge et al. | |
| 7,045,459 B2 | | 5/2006 | Freidhoff | |
| 7,221,920 B2 | * | 5/2007 | Abe et al. | 455/255 |
| 7,316,965 B2 | | 1/2008 | Hooper et al. | |
| 7,352,040 B2 | | 4/2008 | Partridge et al. | |
| 7,373,835 B2 | | 5/2008 | Matsubara | |
| 7,402,907 B2 | | 7/2008 | Ohguro | |
| 7,451,647 B2 | | 11/2008 | Matsuhisa et al. | |
| 7,570,134 B2 | | 8/2009 | Koji | |
| 7,638,429 B2 | | 12/2009 | Freidhoff | |
| 7,755,454 B2 | | 7/2010 | Tanaka et al. | |
| 7,875,941 B2 | | 1/2011 | Freidhoff | |

(Continued)

FOREIGN PATENT DOCUMENTS

| | | | | |
|---|---|---|---|---|
| JP | 62-047203 | * | 2/1987 | H03B 5/32 |
| JP | 2005-086469 | | 3/2005 | |

(Continued)

*Primary Examiner* — Levi Gannon
(74) *Attorney, Agent, or Firm* — Harness, Dickey & Pierce, P.L.C.

(57) ABSTRACT

An oscillator includes: a plurality of MEMS vibrators each having a first terminal and a second terminal, and having respective resonant frequencies different from each other; an amplifier circuit having an input terminal and an output terminal; a connection circuit adapted to connect the first terminal of one of the MEMS vibrators and the input terminal to each other, and the second terminal of the one of the MEMS vibrators and the output terminal to each other; a signal reception terminal adapted to receive a switching signal used to switch a state of the connection circuit; and a switching circuit adapted to make the connection circuit switch the MEMS vibrator to be connected to the amplifier circuit based on the switching signal, wherein the MEMS vibrators are housed in an inside of a cavity, and the signal reception terminal is disposed outside the cavity.

6 Claims, 11 Drawing Sheets

(56) References Cited

U.S. PATENT DOCUMENTS

| | | |
|---|---|---|
| 7,894,205 B2 | 2/2011 | Lee et al. |
| 7,977,757 B2 | 7/2011 | Yoshikawa et al. |
| 7,994,594 B2 | 8/2011 | Inaba et al. |
| 7,999,335 B2 | 8/2011 | Mikami et al. |
| 8,035,176 B2 | 10/2011 | Jung et al. |
| 8,305,152 B2 * | 11/2012 | Watanabe et al. ............. 331/154 |
| 2004/0227578 A1 * | 11/2004 | Hamalainen .............. 331/107 A |
| 2005/0275480 A1 * | 12/2005 | Nishio .......................... 331/158 |
| 2007/0190680 A1 | 8/2007 | Fukuda et al. |
| 2007/0296513 A1 * | 12/2007 | Ruile et al. ................ 331/116 R |
| 2008/0143450 A1 * | 6/2008 | Matsumoto et al. ...... 331/116 R |
| 2011/0281389 A1 | 11/2011 | Mikami et al. |
| 2011/0303457 A1 | 12/2011 | Inaba et al. |
| 2012/0235760 A1 | 9/2012 | Yajima |
| 2012/0262243 A1 | 10/2012 | Yajima |
| 2013/0120074 A1 * | 5/2013 | Zuo et al. ................ 331/116 FE |

FOREIGN PATENT DOCUMENTS

| | | | | |
|---|---|---|---|---|
| JP | 2005-142852 | | 6/2005 | |
| JP | 2005-517546 | | 6/2005 | |
| JP | 2005-212017 | | 8/2005 | |
| JP | 2005-322666 | | 11/2005 | |
| JP | 2006-050119 | * | 2/2006 | ............... H03B 5/30 |
| JP | 2006-211468 | | 8/2006 | |
| JP | 2006-224220 | | 8/2006 | |
| JP | 2006-321016 | | 11/2006 | |
| JP | 2007-000994 | | 1/2007 | |
| JP | 2007-114078 | | 5/2007 | |
| JP | 2007-150736 | | 6/2007 | |
| JP | 2007-210083 | | 8/2007 | |
| JP | 2007-524995 | | 8/2007 | |
| JP | 2007-281715 | | 10/2007 | |
| JP | 2008-221435 | | 9/2008 | |
| JP | 2008-277743 | | 11/2008 | |
| JP | 2008-546553 | | 12/2008 | |
| JP | 2009-064954 A | | 3/2009 | |
| JP | 2009-158485 A | | 7/2009 | |
| JP | 2009-160686 A | | 7/2009 | |
| JP | 2009-188785 | | 8/2009 | |
| JP | 2010-021225 | | 1/2010 | |
| JP | 2010-030020 | | 2/2010 | |
| JP | 2010-056764 | | 3/2010 | |
| JP | 2010-511524 A | | 4/2010 | |

* cited by examiner

OSCILLATOR HAVING A PLURALITY OF SWITCHABLE MEMS VIBRATORS

BACKGROUND

1. Technical Field

The present invention relates to an oscillator.

2. Related Art

Micro-electromechanical systems (MEMS) are one of microstructure formation technologies, and denote, for example, a technology of manufacturing a micron order of fine electronic machine system and products derived therefrom. A vibration element (a MEMS vibrator) made using the MEMS technology has been developed. Further, an oscillator using the MEMS vibrator has been developed.

One of the important characteristics of the oscillator is frequency accuracy. However, there is a limitation in raising the working accuracy in production of the MEMS vibrator itself in order to obtain high frequency accuracy. Therefore, there has been known a method of performing trimming on the MEMS vibrator itself to thereby fine-tune the frequency in order to obtain high frequency accuracy.

Further, JP-A-2010-56764 discloses the MEMS vibrator the resonant frequency of which can be controlled in accordance with a controlling direct-current voltage supplied externally.

However, in order for performing trimming on the MEMS vibrator itself, a working machine dedicated to trimming and the time for performing trimming become necessary. Therefore, it is disadvantageous in terms of manufacturing cost. Further, since there is no chance to perform trimming after the MEMS vibrator is encapsulated in a package, it is difficult to perform accurate trimming considering the influence of the parasitic component of the package.

Further, in the MEMS vibrator disclosed in the patent literature described above, since it is required to continue to externally provide the controlling direct-current voltage with an appropriate value, the device is difficult to use as an oscillator.

SUMMARY

An advantage of some aspects of the invention is to provide an oscillator the oscillation frequency of which can be adjusted even after the oscillator is encapsulated in a package.

An aspect of the invention is directed to an oscillator including a plurality of MEMS vibrators each having a first terminal and a second terminal, and having respective resonant frequencies different from each other, an amplifier circuit having an input terminal and an output terminal, a connection circuit adapted to connect the first terminal of one of the MEMS vibrators and the input terminal to each other, and the second terminal of the one of the MEMS vibrators and the output terminal to each other to thereby connect the one of the MEMS vibrators and the amplifier circuit to each other, a signal reception terminal adapted to receive a switching signal used to switch a state of the connection circuit, and a switching circuit adapted to make the connection circuit switch the MEMS vibrator to be connected to the amplifier circuit based on the switching signal, wherein the MEMS vibrators are housed in an inside of a cavity, and the signal reception terminal is disposed outside the cavity.

"To connect" denotes "to connect electrically," and includes not only the case of connecting something in a direct-current manner, but also the case of connecting something in an alternating-current manner.

According to such an oscillator, the MEMS vibrator used in the oscillator can be selected using the connection circuit for connecting one of the MEMS vibrators having respective resonant frequencies different from each other and the amplifier circuit to each other. Further, since the signal reception terminal is disposed outside the cavity housing the MEMS vibrators, the MEMS vibrator can be selected even after the MEMS vibrators have been housed in the cavity. Thus, there can be realized the oscillator the oscillation frequency of which can be adjusted even after having been encapsulated in the package.

In the oscillator of the above aspect of the invention, it is possible that the connection circuit includes at least one of a first switch adapted to switch a connection state between the first terminal of the MEMS vibrator and the input terminal and a second switch adapted to switch a connection state between the second terminal of the MEMS vibrator and the output terminal.

The first switch and the second switch each have a configuration capable of switching at least the alternating-current connection state one or more times, and each can be formed of, for example, an analog switch or the like capable of switching the connection state many times, or a fuse or the like capable of switching the connection state only once.

According to such an oscillator, by including at least one of the first switch and the second switch, the connection circuit for connecting one of the MEMS vibrators and the amplifier circuit to each other can easily be realized. By, for example, setting the state of at least one of the first switch and the second switch to the state of not making at least the alternating-current connection, it is possible to set the MEMS vibrator to the state in which it is not selected as the MEMS vibrator used in the oscillator.

In the oscillator of the above aspect of the invention, it is possible that the connection circuit includes the first switch and the second switch.

According to such an oscillator, it is possible to electrically separate other MEMS vibrators than the MEMS vibrator connected to the amplifier circuit by the connection circuit from both of the input terminal and the output terminal of the amplifier circuit. Thus, it can be prevented that the MEMS vibrators other than the MEMS vibrator connected to the amplifier circuit by the connection circuit become an unwanted load for the oscillator.

In the oscillator of the above aspect of the invention, it is possible that the connection circuit connects the first terminal and the second terminal of the MEMS vibrator, which fails to be connected to the amplifier circuit, to a first reference potential.

According to such an oscillator, by connecting the first terminal and the second terminal of the MEMS vibrator not connected to the amplifier circuit by the connection circuit to the first reference potential, it is possible to more surely separate the MEMS vibrator not connected to the amplifier circuit by the connection circuit electrically from both of the input terminal and the output terminal of the amplifier circuit. Thus, the MEMS vibrator not connected to the amplifier circuit by the connection circuit can be prevented from becoming a transmission source of a signal hindering the oscillation of the oscillator.

In the oscillator of the above aspect of the invention, it is possible that the connection circuit includes a third switch adapted to switch a connection state between the first terminal of the MEMS vibrator, which fails to be connected to the amplifier circuit, and the first reference potential, and a fourth switch adapted to switch a connection state between the second terminal of the MEMS vibrator, which fails to be connected to the amplifier circuit, and the first reference potential.

The third switch and the fourth switch each have a configuration capable of switching at least the alternating-current connection state one or more times, and each can be formed of, for example, an analog switch or the like capable of switching the connection state many times, or a fuse or the like capable of switching the connection state only once.

According to such an oscillator, by setting the third switch and the fourth switch to the connected state, it is possible to more surely separate the MEMS vibrator not connected to the amplifier circuit by the connection circuit electrically from both of the input terminal and the output terminal of the amplifier circuit.

In the oscillator of the above aspect of the invention, it is possible to further include a first capacitor connected between the input terminal and a second reference potential, and a second capacitor connected between the output terminal and the second reference potential.

According to such an oscillator, it is possible to obtain the oscillation circuit having the resonant circuit composed of the MEMS vibrator thus selected, the first capacitor, and the second capacitor.

In the oscillator of the above aspect of the invention, it is possible that the inside of the cavity is in a reduced-pressure state.

If the inside of the cavity is in a reduced-pressure state, the MEMS vibrator is easier to vibrate compared to the case of an atmospheric-pressure state. According to the oscillator related to the aspect of the invention, the oscillation frequency can be adjusted even after the MEMS vibrators have been housed in the inside of the cavity in the reduced-pressure state.

BRIEF DESCRIPTION OF THE DRAWINGS

The invention will be described with reference to the accompanying drawings, wherein like numbers reference like elements.

FIG. 10 is a plan view schematically showing a configuration example of the MEMS vibrators through.

DESCRIPTION OF EXEMPLARY EMBODIMENTS

Hereinafter, some preferred embodiments of the invention will be described in detail with reference to the accompanying drawings. It should be noted that the embodiments described below do not unreasonably limit the content of the invention as set forth in the appended claims. Further, all of the constituents described below are not necessarily essential elements of the invention.

1. Oscillator According to First Embodiment

Figure 1:
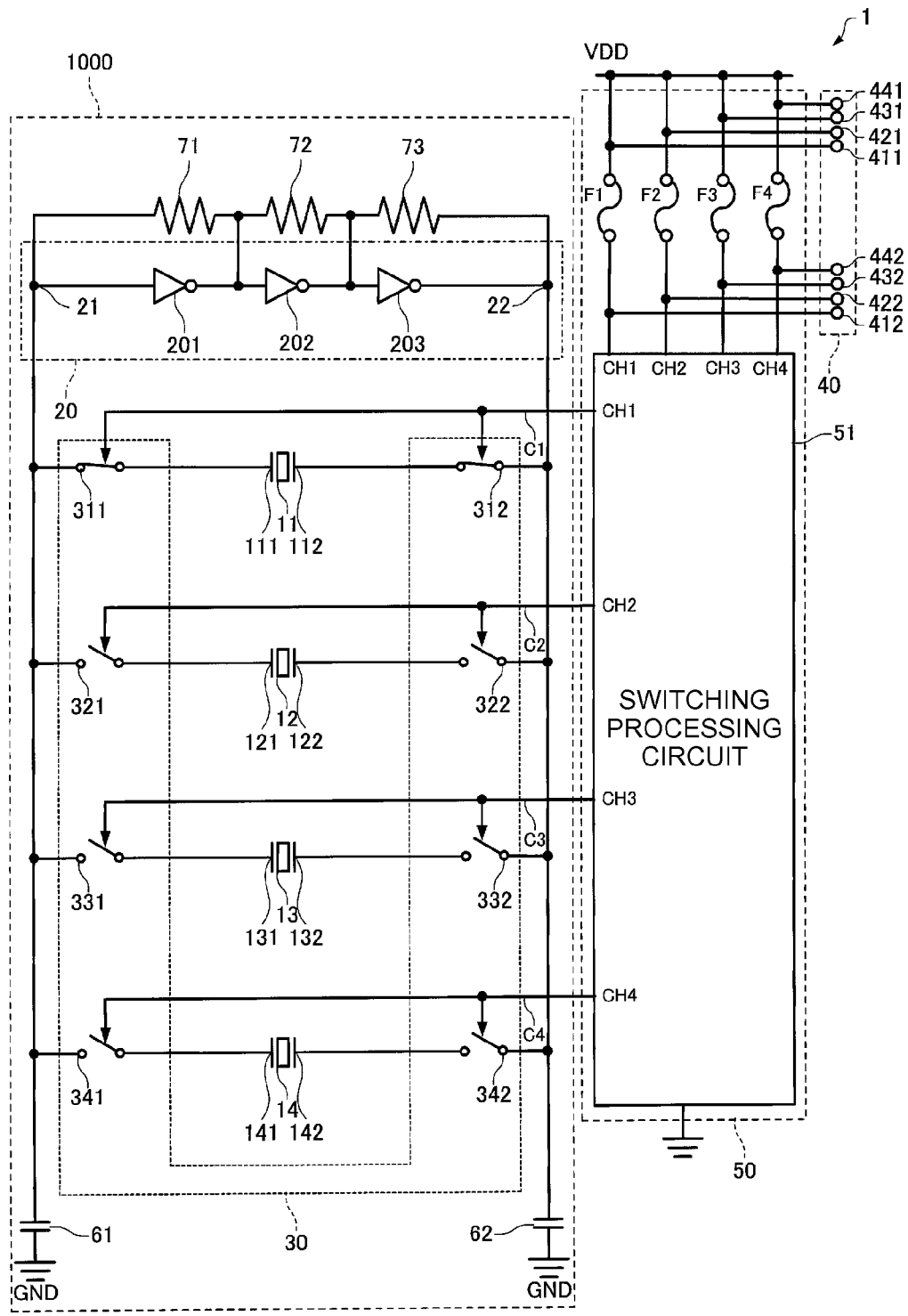
FIG. 1 is a circuit diagram showing an oscillator according to a first embodiment of the invention.

FIG. 1 is a circuit diagram showing an oscillator 1 according to a first embodiment. Hereinafter, the case in which a second reference potential is the ground potential GND will be explained as an example. Further, although a non-inverting amplifier circuit and an inverting amplifier circuit can be cited as an amplifier circuit, the inverting amplifier circuit is preferably used from a viewpoint of stability. In the explanation below, the case of using the inverting amplifier circuit as the amplifier circuit will be explained as an example.

The oscillator 1 according to the first embodiment includes a plurality of MEMS vibrators 11 through 14 each having a first terminal and a second terminal, and having respective resonant frequencies different from each other, an amplifier circuit 20 having an input terminal 21 and an output terminal 22, a connection circuit 30 for connecting the input terminal 21 to the first terminal of one of the MEMS vibrators 11 through 14 and connecting the output terminal 22 to the second terminal of the same MEMS vibrator to thereby connect one of the MEMS vibrators 11 through 14 and the amplifier circuit 20 to each other, a signal reception terminal 40 for receiving switching signals for switching the state of the connection circuit 30, and a switching circuit 50 for making the connection circuit 30 switch the MEMS vibrator to be connected to the amplifier circuit 20 based on the switching signals. Further, the MEMS vibrators 11 through 14 are housed inside a cavity, and the signal reception terminal 40 is disposed outside the cavity. In the example shown in FIG. 1, the oscillator 1 is configured including an oscillation circuit 1000. The oscillation circuit 1000 is configured including the MEMS vibrators 11 through 14, the amplifier circuit 20, and the connection circuit 30.

The MEMS vibrators 11 through 14 each can also be, for example, an electrostatic MEMS vibrator or a piezoelectric MEMS vibrator. Further, the MEMS vibrators 11 through 14 can also be formed on the same substrate. In this case, the MEMS vibrators 11 through 14 can also be manufactured in the same manufacturing process. A configuration example of the MEMS vibrators 11 through 14 and the relationship with the cavity will be described in detail in the section of "6. Configuration Example of MEMS Vibrators."

The number of MEMS vibrators included in the oscillator 1 can arbitrarily be designed to be a natural number equal to or greater than two. In the example shown in FIG. 1, the oscillator 1 is configured including four MEMS vibrators 11 through 14. The MEMS vibrator 11 has the first terminal 111 and the second terminal 112. The MEMS vibrator 12 has the first terminal 121 and the second terminal 122. The MEMS vibrator 13 has the first terminal 131 and the second terminal 132. The MEMS vibrator 14 has the first terminal 141 and the second terminal 142.

The MEMS vibrators 11 through 14 have respective resonant frequencies different from each other. Assuming that, for example, the resonant frequency of the MEMS vibrator 11 is f1, the resonant frequency of the MEMS vibrator 12 is f2, the resonant frequency of the MEMS vibrator 13 is f3, and the resonant frequency of the MEMS vibrator 14 is f4, the MEMS vibrators 11 through 14 can also be configured so that the magnitude relation between the resonant frequencies f1 through f4 fulfills f2<f1<f3<f4. It is preferable to set the values of the frequencies f1 through f4 to the values close to each other to the extent that the accuracy to the target frequency required as the oscillator is fulfilled by selecting either one of the MEMS vibrators 11 through 14 in consideration of, for example, the variation range of the frequency due to the manufacturing variation in the MEMS vibrators 11 through 14. The amplifier circuit 20 has the input terminal 21 and the output terminal 22. The amplifier circuit 20 can also be configured by combining a plurality of inverters (inverting circuits) and amplifier circuits so that the desired oscillation conditions are fulfilled. In the example shown in FIG. 1, the amplifier circuit 20 is composed of an inverter 201, an inverter 202, and an inverter 203 connected in series sequentially from the input terminal 21 toward the output terminal 22.

The oscillator 1 can also be configured including a feedback resistor to the amplifier circuit 20. In the example shown in FIG. 1, an input terminal and an output terminal of the inverter 201 are connected to each other via a resistor 71, an input terminal and an output terminal of the inverter 202 are connected to each other via a resistor 72, an input terminal and an output terminal of the inverter 203 are connected to each other via a resistor 73.

The connection circuit 30 connects the first terminal of one of the MEMS vibrators 11 through 14 to the input terminal 21, and connects the second terminal of the same MEMS vibrator to the output terminal 22 to thereby connect the one of the MEMS vibrators 11 through 14 and the amplifier circuit 20 to each other. FIG. 1 shows the state in which the connection circuit 30 connects the MEMS vibrator 11 among the MEMS vibrators 11 through 14 and the amplifier circuit 20 to each other. Hereinafter, the case in which the connection circuit 30 connects the MEMS vibrator 11 among the MEMS vibrators 11 through 14 and the amplifier circuit 20 to each other will be explained as an example.

The first terminal 111 of the MEMS vibrator 11 connected to the amplifier circuit 20 by the connection circuit 30 is connected to the input terminal 21 of the amplifier circuit 20 at least in an alternating-current manner. In the example shown in FIG. 1, the first terminal 111 of the MEMS vibrator 11 is connected to the input terminal 21 of the amplifier circuit 20 not only in an alternating-current manner, but also in a direct-current manner.

The second terminal 112 of the MEMS vibrator 11 connected to the amplifier circuit 20 by the connection circuit 30 is connected to the output terminal 22 of the amplifier circuit 20 at least in an alternating-current manner. In the example shown in FIG. 1, the second terminal 112 of the MEMS vibrator 11 is connected to the output terminal 22 of the amplifier circuit 20 not only in an alternating-current manner, but also in a direct-current manner.

In the example shown in FIG. 1, the first terminal 121 of the MEMS vibrator 12 not connected to the amplifier circuit 20 by the connection circuit 30 is not connected to the input terminal 21 of the amplifier circuit 20 not only in an alternating-current manner, but also in a direct-current manner. The second terminal 122 of the MEMS vibrator 12 not connected to the amplifier circuit 20 by the connection circuit 30 is not connected to the output terminal 22 of the amplifier circuit 20 not only in an alternating-current manner, but also in a direct-current manner.

Further, in the example shown in FIG. 1, the first terminal 131 of the MEMS vibrator 13 not connected to the amplifier circuit 20 by the connection circuit 30 is not connected to the input terminal 21 of the amplifier circuit 20 not only in an alternating-current manner, but also in a direct-current manner. The second terminal 132 of the MEMS vibrator 13 not connected to the amplifier circuit 20 by the connection circuit 30 is not connected to the output terminal 22 of the amplifier circuit 20 not only in an alternating-current manner, but also in a direct-current manner.

Further, in the example shown in FIG. 1, the first terminal 141 of the MEMS vibrator 14 not connected to the amplifier circuit 20 by the connection circuit 30 is not connected to the input terminal 21 of the amplifier circuit 20 not only in an alternating-current manner, but also in a direct-current manner. The second terminal 142 of the MEMS vibrator 14 not connected to the amplifier circuit 20 by the connection circuit 30 is not connected to the output terminal 22 of the amplifier circuit 20 not only in an alternating-current manner, but also in a direct-current manner.

The connection circuit 30 can include at least one of groups of switches, namely first switches 311, 321, 331, and 341 for switching the connection state between the first terminals of the MEMS vibrators 11 through 14 and the input terminal 21 of the amplifier circuit 20, and second switches 312, 322, 332, and 342 for switching the connection state between the second terminals of the MEMS vibrators 11 through 14 and the output terminal 22 of the amplifier circuit 20.

In the example shown in FIG. 1, the oscillator 1 is configured including the first switch 311 for switching at least the alternating-current connection state between the first terminal 111 of the MEMS vibrator 11 and the input terminal 21 of the amplifier circuit 20, the first switch 321 for switching at least the alternating-current connection state between the first terminal 121 of the MEMS vibrator 12 and the input terminal 21 of the amplifier circuit 20, the first switch 331 for switching at least the alternating-current connection state between the first terminal 131 of the MEMS vibrator 13 and the input terminal 21 of the amplifier circuit 20, and the first switch 341 for switching at least the alternating-current connection state between the first terminal 141 of the MEMS vibrator 14 and the input terminal 21 of the amplifier circuit 20.

Further, in the example shown in FIG. 1, the oscillator 1 is configured including the second switch 312 for switching at least the alternating-current connection state between the second terminal 112 of the MEMS vibrator 11 and the output terminal 22 of the amplifier circuit 20, the second switch 322 for switching at least the alternating-current connection state between the second terminal 122 of the MEMS vibrator 12 and the output terminal 22 of the amplifier circuit 20, the second switch 332 for switching at least the alternating-current connection state between the second terminal 132 of the MEMS vibrator 13 and the output terminal 22 of the amplifier circuit 20, and the second switch 342 for switching at least the alternating-current connection state between the second terminal 142 of the MEMS vibrator 14 and the output terminal 22 of the amplifier circuit 20.

In other words, in the example shown in FIG. 1, the connection circuit 30 is configured including the first switches and the second switches corresponding respectively to the MEMS vibrators 11 through 14.

The first switches 311, 321, 331, and 341 and the second switches 312, 322, 332, and 342 each have a configuration capable of switching at least the alternating-current connection state one or more times, and each can be formed of, for example, an analog switch or the like capable of switching the connection state many times, or a fuse or the like capable of switching the connection state only once.

Figure 2:
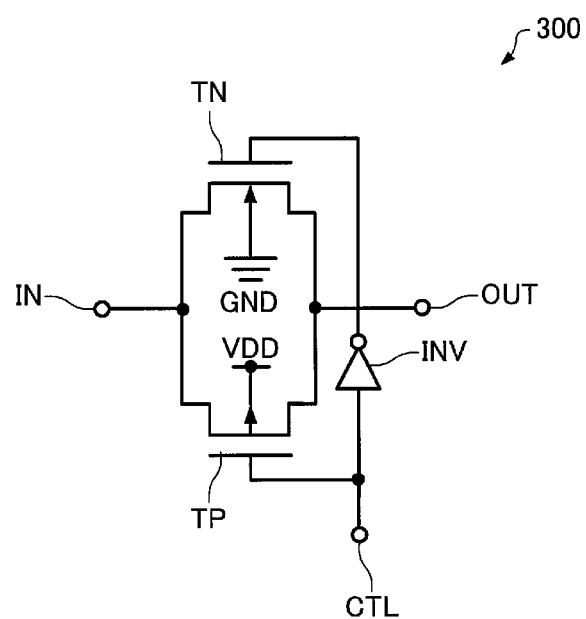
FIG. 2 is a circuit diagram showing a configuration example of an analog switch.

FIG. 2 is a circuit diagram showing a configuration example of an analog switch. The analog switch 300 is configured including an NMOS transistor TN and a PMOS transistor TP connected in parallel between an input terminal IN and an output terminal OUT. The back gate of the NMOS transistor TN is connected to the ground potential GND, and the back gate of the PMOS transistor TP is connected to the power-supply potential VDD as a positive potential. A control signal input from a control terminal CTL is input to the gate of the PMOS transistor, and at the same time, inverted by an inverter INV, and is then input to the gate of the NMOS transistor TN.

Therefore, in the analog switch 300, a low-resistance state (i.e., the ON state of the switch) is made between the input terminal IN and the output terminal OUT by inputting the ground potential GND to the control terminal CTL as the control signal, and a high-resistance state (i.e., the OFF state of the switch) is made between the input terminal IN and the output terminal OUT by inputting the power-supply potential VDD to the control terminal CTL as the control signal. It should be noted that the switch which can be adopted to the oscillator 1 is not limited thereto, but a variety of switches known to the public can be adopted.

The signal reception terminal 40 receives the switching signals for switching the state of the connection circuit 30. In the example shown in FIG. 1, the signal reception terminal 40 is configured including a terminal 411, a terminal 412, a terminal 421, a terminal 422, a terminal 431, a terminal 432, a terminal 441, and a terminal 442.

The switching circuit 50 makes the connection circuit 30 switch the MEMS vibrator to be connected to the amplifier circuit 20 based on the switching signals received by the signal reception terminal 40. In the example shown in FIG. 1, the switching circuit 50 is configured including a switching processing circuit 51 and fuses F1 through F4.

In the example shown in FIG. 1, the switching processing circuit 51 outputs control signals C1 through C4 to thereby make the connection circuit 30 switch the connection state. In other words, the switching processing circuit 51 outputs the control signals C1 through C4 to thereby control the connection state of the connection circuit 30. The arrows shown in FIG. 1 indicate the control signals C1 through C4 to the respective switches.

The control signal C1 is a signal for performing the control related to the MEMS vibrator 11. In the example shown in FIG. 1, the control signal C1 is input to the control terminals of the first switch 311 and the second switch 312.

The control signal C2 is a signal for performing the control related to the MEMS vibrator 12. In the example shown in FIG. 1, the control signal C2 is input to the control terminals of the first switch 321 and the second switch 322.

The control signal C3 is a signal for performing the control related to the MEMS vibrator 13. In the example shown in FIG. 1, the control signal C3 is input to the control terminals of the first switch 331 and the second switch 332.

The control signal C4 is a signal for performing the control related to the MEMS vibrator 14. In the example shown in FIG. 1, the control signal 41 is input to the control terminals of the first switch 341 and the second switch 342.

In the example shown in FIG. 1, the switching processing circuit 51 is connected to the power-supply potential VDD as a positive potential via the fuses F1 through F4. Further, the switching processing circuit 51 is configured so as to output the control signals C1 through C4 based on the cutting states of the fuses F1 through F4. It is also possible for the switching processing circuit 51 to output the control signal C1 based on the cutting state of the fuse F1, the control signal C2 based on the cutting state of the fuse F2, the control signal C3 based on the cutting state of the fuse F3, and the control signal C4 based on the cutting state of the fuse F4.

One end of the fuse F1 is connected to the terminal 411, and the other end is connected to the terminal 412. Therefore, by applying a predetermined electrical current between the terminal 411 and the terminal 412 as the switching signal, it is possible to cut the fuse F1.

One end of the fuse F2 is connected to the terminal 421, and the other end is connected to the terminal 422. Therefore, by applying a predetermined electrical current between the terminal 421 and the terminal 422 as the switching signal, it is possible to cut the fuse F2.

One end of the fuse F3 is connected to the terminal 431, and the other end is connected to the terminal 432. Therefore, by applying a predetermined electrical current between the terminal 431 and the terminal 432 as the switching signal, it is possible to cut the fuse F3.

One end of the fuse F4 is connected to the terminal 441, and the other end is connected to the terminal 442. Therefore, by applying a predetermined electrical current between the terminal 441 and the terminal 442 as the switching signal, it is possible to cut the fuse F4.

According to the oscillator 1 of the first embodiment, the MEMS vibrator used in the oscillator 1 can be selected using the connection circuit 30 for connecting one of the MEMS vibrators 11 through 14 with respective resonant frequencies different from each other and the amplifier circuit 20. Further, since the signal reception terminal 40 is disposed outside the cavity housing the MEMS vibrators 11 through 14, the MEMS vibrator can be selected even after the MEMS vibrators 11 through 14 have been housed in the cavity. Thus, there can be realized the oscillator the oscillation frequency of which can be adjusted even after the MEMS vibrators 11 through 14 have been encapsulated in the package.

In some cases, the frequency output from the oscillation circuit 1000 is different between before and after the MEMS vibrators 11 through 14 are encapsulated in the package due to the influence of the parasitic component of the package. According to the oscillator 1 related to the first embodiment, since the MEMS vibrators 11 through 14 can be selected after the MEMS vibrators 11 through 14 have been encapsulated in the package, it is possible to select more appropriate MEMS vibrator.

Further, according to the oscillator 1 related to the first embodiment, the MEMS vibrator (the MEMS vibrator 11 in the example shown in FIG. 1) used in the oscillator 1 can be selected using the connection circuit 30 for connecting one of the MEMS vibrators 11 through 14 with respective resonant frequencies different from each other and the amplifier circuit 20. Thus, the MEMS vibrator with the resonant frequency closer to the target oscillation frequency can be selected even if the resonant frequency of the MEMS vibrator varies due to the variation in the manufacturing process. Therefore, the oscillator with a suppressed variation in the oscillation frequency can be realized.

Further, the oscillator 1 according to the first embodiment can easily select the MEMS vibrator used in the oscillator 1 by selectively cutting the fuses F1 through F4 in an appropriate manner.

Further, according to the oscillator 1 related to the first embodiment, by including at least one of the groups of switches, namely the first switches 311, 321, 331, and 341 and the second switches 312, 322, 332, and 342, the connection circuit 30 for connecting either one of the MEMS vibrators 11 through 14 and the amplifier circuit 20 to each other can easily be realized. By, for example, setting the state of at least one of the first switch 311 and the second switch 312 to the state of not making at least the alternating-current connection, it is possible to set the MEMS vibrator 11 to the state in which it is not selected as the MEMS vibrator used in the oscillator 1.

Further, as shown in FIG. 1, the connection circuit 30 can include both of the first switches 311, 321, 331, and 341, and the second switches 312, 322, 332, and 342.

According to the oscillator 1 described above, the MEMS vibrators (the MEMS vibrators 12 through 14 in the example shown in FIG. 1) other than the MEMS vibrator (the MEMS vibrator 11 in the example shown in FIG. 1) connected to the amplifier circuit 20 by the connection circuit 30 can electrically be separated from both of the input terminal 21 and the output terminal 22 of the amplifier circuit 20. Thus, it can be prevented that the MEMS vibrators other than the MEMS vibrator connected to the amplifier circuit 20 by the connection circuit 30 become an unwanted load for the oscillator 1.

The oscillator 1 can be configured including a first capacitor 61 connected between the input terminal 21 of the amplifier circuit 20 and the second reference potential (the ground potential GND), and a second capacitor 62 connected between the output terminal 22 of the amplifier circuit 20 and the second reference potential (the ground potential GND).

According to the oscillator 1 described above, an oscillator having a resonant circuit composed of the MEMS vibrator (the MEMS vibrator 11 in the example shown in FIG. 1) connected to the amplifier circuit 20 by the connection circuit 30, the first capacitor 61, and the second capacitor 62 can be obtained.

2. Oscillator According to Second Embodiment

Figure 3:
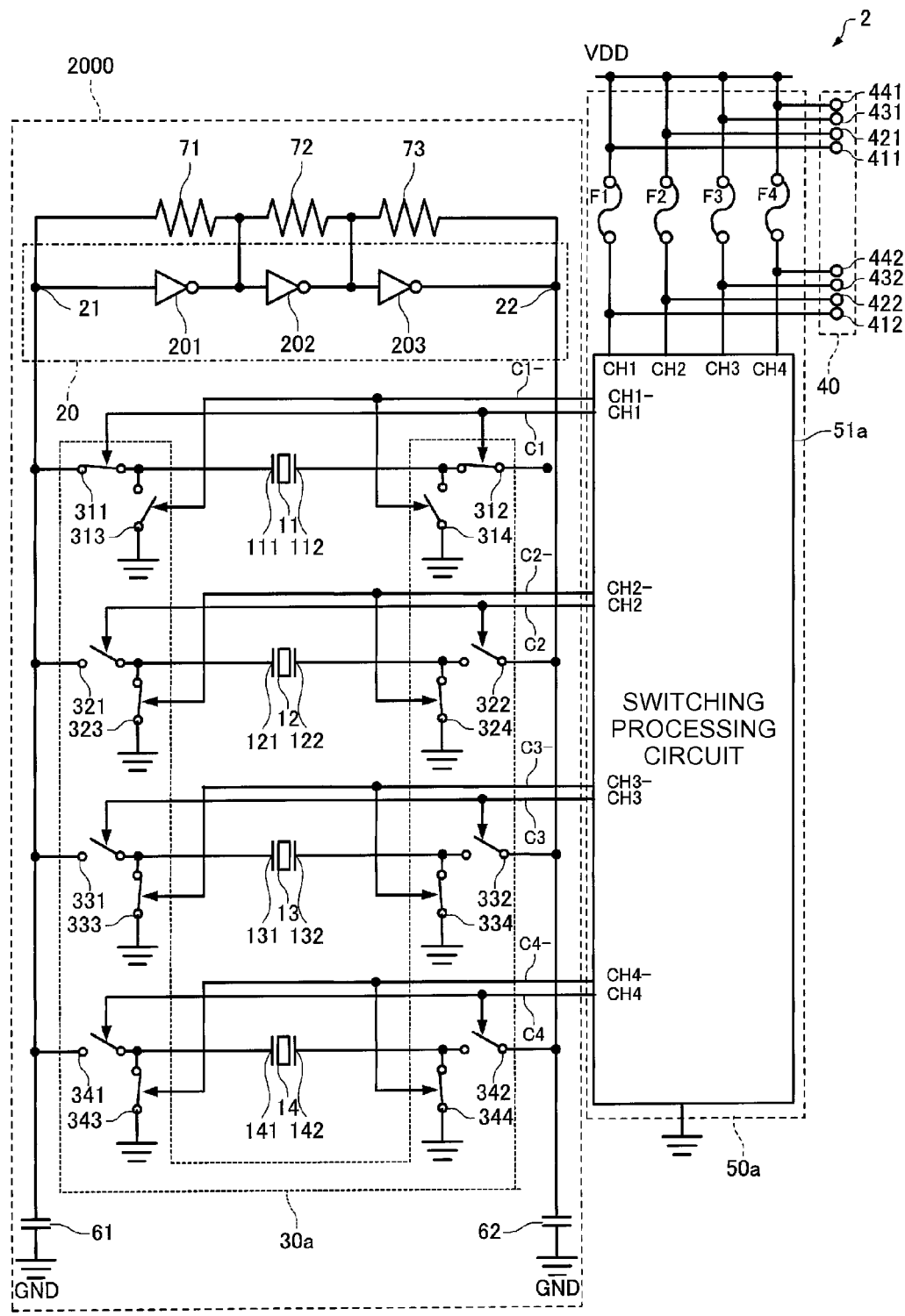
FIG. 3 is a circuit diagram showing an oscillator according to a second embodiment of the invention.

FIG. 3 is a circuit diagram showing an oscillator 2 according to a second embodiment. Hereinafter, the constituents different from those of the oscillator 1 according to the first embodiment will be described in detail, and the constituents substantially the same as those of the oscillator 1 according to the first embodiment will be denoted by the same reference numerals, and the explanation therefor will be omitted. Further, the case in which the first reference potential is the ground potential GND will hereinafter be explained as an example.

In the example shown in FIG. 3, the oscillator 2 is configured including an oscillation circuit 2000. The oscillation circuit 2000 is configured including the MEMS vibrators 11 through 14, the amplifier circuit 20, and a connection circuit 30*a*.

Further, in the example shown in FIG. 3, the oscillator 2 is configured including a switching circuit 50*a*. The switching circuit 50*a* is configured including a switching processing circuit 51*a* and the fuses F1 through F4.

In the oscillator 2 according to the second embodiment, the connection circuit 30*a* is configured so as to connect the first terminals and the second terminals of the MEMS vibrators (the MEMS vibrators 12 through 14 in the example shown in FIG. 3) not connected to the amplifier circuit 20 to the first reference potential (the ground potential GND).

Further, in the example shown in FIG. 3, the first terminal 111 and the second terminal 112 of the MEMS vibrator 11 connected to the amplifier circuit 20 by the connection circuit 30*a* are configured so as not to be connected to the first reference potential (the ground potential GND).

In the example shown in FIG. 3, the MEMS vibrators 12 through 14 are electrically separated from the amplifier circuit 20 if the first switches 321, 331, and 341 and the second switches 322, 332, and 342 are ideal switches. However, in the actual switches, it is extremely difficult to completely cut off in particular the alternating-current signal.

According to the oscillator 2 related to the second embodiment, by connecting the first terminals and the second terminals of the MEMS vibrators (the MEMS vibratos 12 through 14 in the example shown in FIG. 3), which are not connected to the amplifier circuit 20 by the connection circuit 30*a*, to the first reference potential (the ground potential GND), the MEMS vibrators 12 through 14 not connected to the amplifier circuit 20 by the connection circuit 30*a* can more surely be separated electrically from both of the input terminal 21 and the output terminal 22 of the amplifier circuit 20. Thus, the MEMS vibrators not connected to the amplifier circuit 20 by the connection circuit 30*a* can be prevented from becoming a transmission source of a signal hindering the oscillation of the oscillator.

As shown in FIG. 3, the connection circuit 30*a* can be configured including third switches 313, 323, 333, and 343 for switching the connection state between the first terminals of the MEMS vibrators not connected to the amplifier circuit 20 and the first reference potential (the ground potential GND), and fourth switches 314, 324, 334, and 344 for switching the connection state between the second terminals of the MEMS vibrators not connected to the amplifier circuit 20 and the first reference potential (the ground potential GND).

In the example shown in FIG. 3, the oscillator 2 is configured including the third switch 313 for switching the connection state between the first terminal 111 of the MEMS vibrator 11 and the ground potential GND, the third switch 323 for switching the connection state between the first terminal 121 of the MEMS vibrator 12 and the ground potential GND, the third switch 333 for switching the connection state between the first terminal 131 of the MEMS vibrator 13 and the ground potential GND, and the third switch 343 for switching the connection state between the first terminal 141 of the MEMS vibrator 14 and the ground potential GND.

Further, in the example shown in FIG. 3, the oscillator 2 is configured including the fourth switch 314 for switching the connection state between the second terminal 112 of the MEMS vibrator 11 and the ground potential GND, the fourth switch 324 for switching the connection state between the second terminal 122 of the MEMS vibrator 12 and the ground potential GND, the fourth switch 334 for switching the connection state between the second terminal 132 of the MEMS vibrator 13 and the ground potential GND, and the fourth switch 344 for switching the connection state between the second terminal 142 of the MEMS vibrator 14 and the ground potential GND.

In other words, in the example shown in FIG. 3, the connection circuit 30*a* is configured including the third switches and the fourth switches corresponding respectively to the MEMS vibrators 11 through 14.

The third switches 313, 323, 333, and 343 and the fourth switches 314, 324, 334, and 344 each have a configuration capable of switching the connection state one or more times, and each can be formed of, for example, an analog switch or the like capable of switching the connection state many times, or a fuse or the like capable of switching the connection state only once. As the analog switches, the analog switch 300 shown in FIG. 2, for example, can be adopted. It should be noted that the switch which can be adopted to the oscillator 2 is not limited thereto, but a variety of switches known to the public can be adopted.

In the example shown in FIG. 3, the switching processing circuit 51 outputs the control signals C1 through C4 and control signals C1- through C4- to thereby make the connection circuit 30*a* switch the connection state. In other words, the switching processing circuit 51 outputs the control signals C1 through C4 and the control signals C1- through C4- to thereby control the connection state of the connection circuit 30*a*. The arrows shown in FIG. 3 indicate the control signals C1 through C4 and control signals C1- through C4- to the respective switches. The control signals C1 through C4 are substantially the same as those of the oscillator 1 explained with reference to FIG. 1.

The control signal C1- is a signal for performing the control related to the MEMS vibrator 11. In the example shown in FIG. 3, the control signal C1- is input to the control terminals of the third switch 313 and the fourth switch 314. Further, the control signal C1- is a signal with a reversed phase with respect to the control signal C1. In other words, it is arranged that the connection state of the first switch 311 and the second switch 312, and the connection state of the third switch 313 and the fourth switch 314 are opposite to each other. The control signal C2- is a signal for performing the control related to the MEMS vibrator 12. In the example shown in FIG. 3, the control signal C2- is input to the control terminals of the third switch 323 and the fourth switch 324. Further, the control signal C2- is a signal with a reversed phase with respect to the control signal C2. In other words, it is arranged that the connection state of the first switch 321 and the second switch 322, and the connection state of the third switch 323 and the fourth switch 324 are opposite to each other. The control signal C3- is a signal for performing the control related to the MEMS vibrator 13. In the example shown in FIG. 3, the control signal C3- is input to the control terminals of the third switch 333 and the fourth switch 334. Further, the control signal C3- is a signal with a reversed phase with respect to the control signal C3. In other words, it is arranged that the connection state of the first switch 331 and the second switch 332, and the connection state of the third switch 333 and the fourth switch 334 are opposite to each other. The control signal C4- is a signal for performing the control related to the MEMS vibrator 14. In the example shown in FIG. 3, the control signal C4- is input to the control terminals of the third switch 343 and the fourth switch 344. Further, the control signal C4- is a signal with a reversed phase with respect to the control signal C4. In other words, it is arranged that the connection state of the first switch 341 and the second switch 342, and the connection state of the third switch 343 and the fourth switch 344 are opposite to each other. According to the oscillator 2 described above, by setting the third switches and the fourth switches to the "connected" state, the MEMS vibrators (the MEMS vibrators 12 through 14 in the example shown in FIG. 3) not connected to the amplifier circuit 20 by the connection circuit 30a can more surely be separated electrically from both of the input terminal 21 and the output terminal 22 of the amplifier circuit 20.

Further, the oscillator 2 according to the second embodiment provides advantages substantially the same as those of the oscillator 1 according to the first embodiment in addition to the advantages described above.

3. Oscillator According to Third Embodiment

Figure 4:
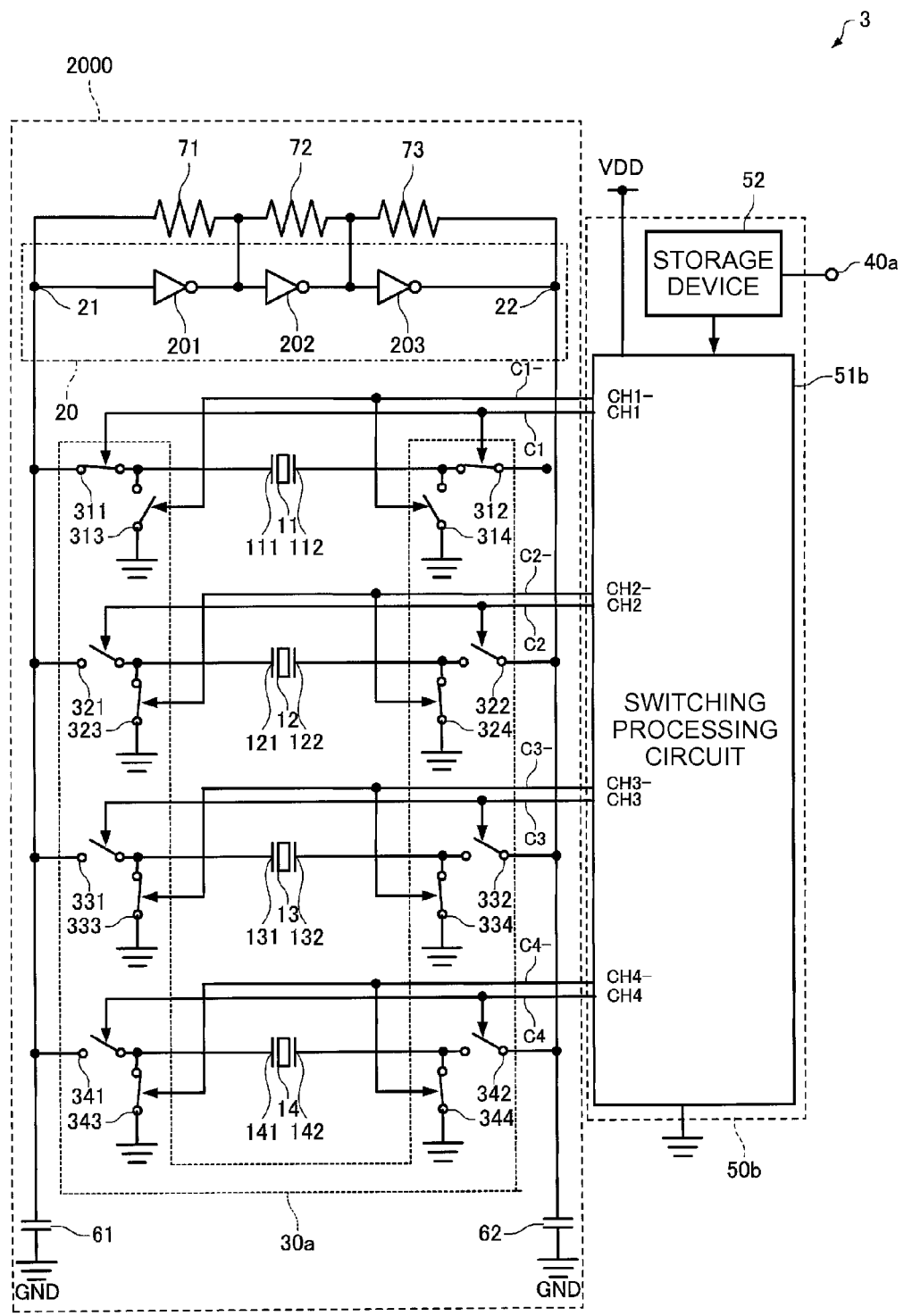
FIG. 4 is a circuit diagram showing an oscillator according to a third embodiment of the invention.

FIG. 4 is a circuit diagram showing an oscillator 3 according to a third embodiment. Hereinafter, the constituents different from those of the oscillator 1 according to the first embodiment and the oscillator 2 according to the second embodiment will be described in detail, and the constituents substantially the same as those of the oscillator 1 according to the first embodiment or the oscillator 2 according to the second embodiment will be denoted by the same reference numerals, and the explanation therefor will be omitted. The oscillator 3 according to the third embodiment is configured including a signal reception terminal 40a for receiving the switching signals for switching the state of the connection circuit 30a, and a switching circuit 50b for making the connection circuit 30a switch the MEMS vibrator to be connected to the amplifier circuit 20 based on the switching signals. The switching circuit 50b is configured including a switching processing circuit 51b and a storage device 52. The switching processing circuit 51b outputs the control signals C1 through C4 and the control signals C1- through C4- to thereby make the connection circuit 30a switch the connection state. In other words, the switching processing circuit 51b outputs the control signals C1 through C4 and the control signals C1- through C4- to thereby control the connection state of the connection circuit 30a. The arrows shown in FIG. 4 indicate the control signals C1 through C4 and control signals C1- through C4- to the respective switches. The control signals C1 through C4 and the control signals C1- through C4- are substantially the same as those of the oscillator 2 explained with reference to FIG. 3.

The storage device 52 stores "information related to the MEMS vibrator to be connected to the amplifier 20." The "information related to the MEMS vibrator to be connected to the amplifier circuit 20" can also be, for example, an identification code corresponding to the MEMS vibrator to be connected to the amplifier circuit 20, or a combination of values of the control signals C1 through C4 and the control signals C1- through C4-. The storage device 52 can also be formed of a nonvolatile memory such as an EEPROM. The "information related to the MEMS vibrator to be connected to the amplifier circuit 20" is input from the signal reception terminals 40a to the storage device 52.

The switching processing circuit 51b is configured so as to output the control signals C1 through C4 and the control signals C1- through C4- based on the "information related to the MEMS vibrator to be connected to the amplifier circuit 20" stored in the storage device 52.

The oscillator 3 according to the third embodiment can easily select the MEMS vibrator used in the oscillator 3 by storing the "information related to the MEMS vibrator to be connected to the amplifier circuit 20" to the storage device 52.

Further, also in the oscillator 3 according to the third embodiment, substantially the same advantages as in the oscillator 2 according to the second embodiment can be obtained.

Figure 5:
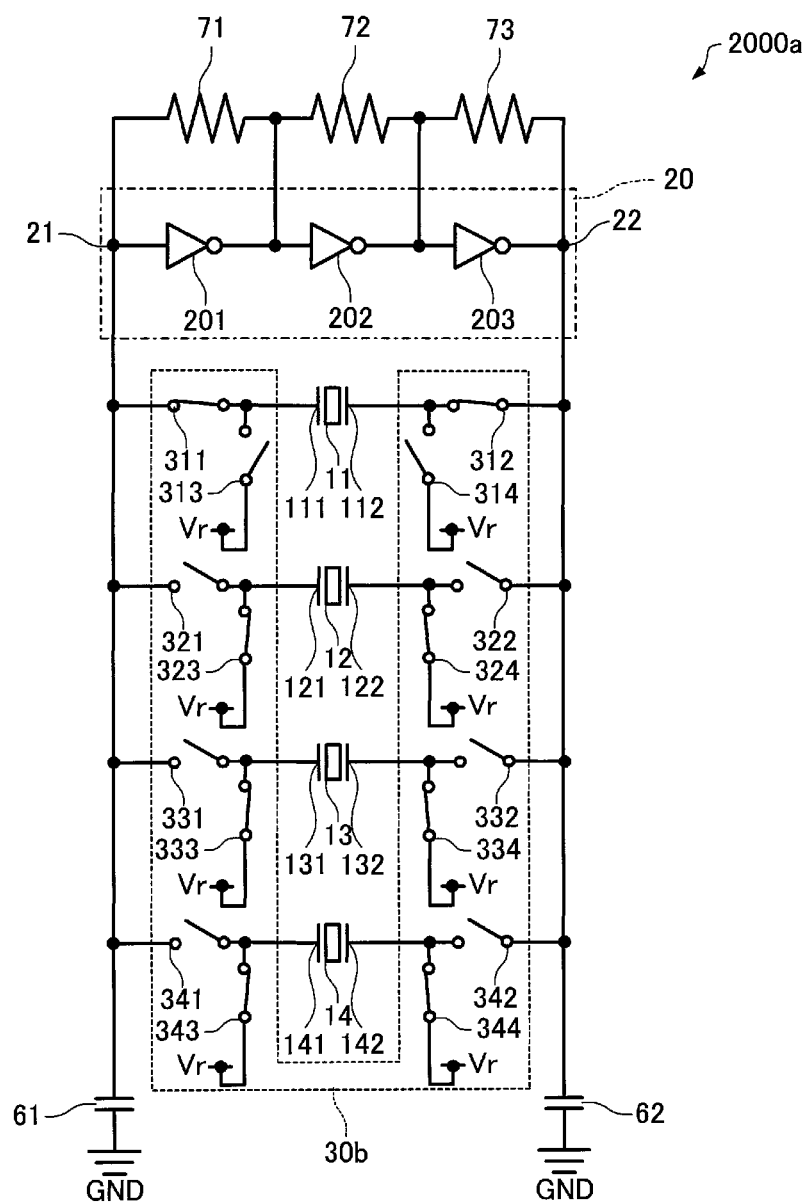
FIG. 5 is a circuit diagram showing an oscillation circuit according to a first modified example of an oscillation circuit applicable to the oscillator and the oscillator.

4. Modified Examples of Oscillation Circuit 4-1. First Modified Example of Oscillation Circuit FIG. 5 is a circuit diagram showing an oscillation circuit 2000a according to a first modified example of the oscillation circuit applicable to the oscillator 2 and the oscillator 3. The oscillation circuit 2000a is different from the oscillation circuit 2000 in the point that the first reference potential is a reference potential Vr. As the reference potential Vr, there can be adopted an arbitrary potential such as the power-supply potential VDD to be supplied to the oscillation circuit 2000a or a bias potential supplied for operating the MEMS vibrators 11 through 14.

Also in the case of applying the oscillation circuit 2000a as the oscillation circuit, substantially the same advantages can be obtained for substantially the same reason as in the oscillator 2 according to the second embodiment.

It should be noted that the reference potential Vr is not required to be a potential specified by the design. It is also possible to, for example, electrically connect the first terminal and the second terminal of each of the MEMS vibrators (the MEMS vibrators 12 through 14 in the example shown in FIG. 5) not connected to the amplifier circuit 20 by the connection circuit 30b to each other via one or more switches. In the example shown in FIG. 5, there is adopted a configuration equivalent to the case in which the first terminal and the second terminal of each of the MEMS vibrators not connected to the amplifier circuit 20 by the connection circuit 30b are electrically connected to each other via the two switches. In other words, various modifications capable of setting the first terminal and the second terminal of each of the MEMS vibrators not connected to the amplifier circuit 20 by the connection circuit 30b to the same potential can be made with respect to the oscillator 2 according to the second embodiment.

4-2. Second Modified Example of Oscillation Circuit

Figure 6:
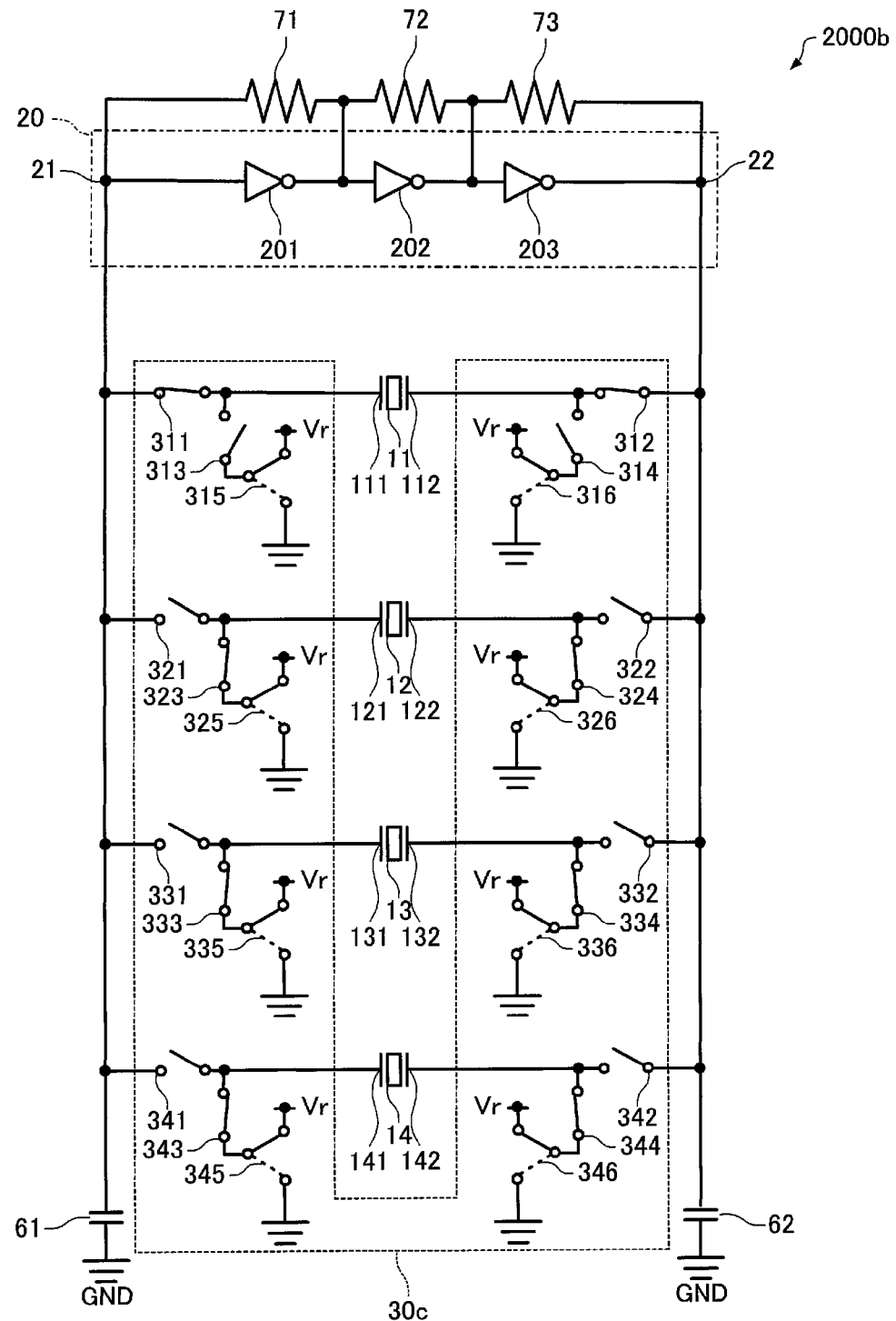
FIG. 6 is a circuit diagram showing an oscillation circuit according to a second modified example of an oscillation circuit applicable to the oscillator and the oscillator.

FIG. 6 is a circuit diagram showing an oscillation circuit 2000b according to a second modified example of the oscillation circuit applicable to the oscillator 2 and the oscillator 3. The oscillation circuit 2000b is different from the oscillation circuit 2000 in the point that fifth switches 315, 325, 335, and 345, and sixth switches 316, 326, 336, and 346 for selecting the first reference potential are provided. In the example shown in FIG. 6, one ends of the fifth switches 315, 325, 335, and 345 are electrically connected sequentially to one ends of the third switches 313, 323, 333, and 343, and the other ends of the fifth switches 315, 325, 335, and 345 are each configured as a changeover switch for selecting either one of the ground potential GND and the reference potential Vr as the first reference potential.

Further, in the example shown in FIG. 6, one ends of the sixth switches 316, 326, 336, and 346 are electrically connected sequentially to one ends of the fourth switches 314, 324, 334, and 344, and the other ends of the sixth switches 316, 326, 336, and 346 are each configured as a changeover switch for selecting either one of the ground potential GND and the reference potential Vr as the first reference potential.

The fifth switches 315, 325, 335, and 345 and the sixth switches 316, 326, 336, and 346 can be composed of a combination of the analog switches shown in FIG. 2.

The connection state of the fifth switches 315, 325, 335, and 345 and the sixth switches 316, 326, 336, and 346 is at least a connection state in which the first terminal and the second terminal of each of the MEMS vibrators not connected to the amplifier circuit 20 by the connection circuit 30c are set to the same electrical potential. In the example shown in FIG. 6, if the reference potential Vr is selected as the first reference potential by the fifth switches 315, 325, 335, and 345, the sixth switches 316, 326, 336, and 346 also select the reference potential Vr as the first reference potential. Similarly, if the ground potential GND is selected as the first reference potential by the fifth switches 315, 325, 335, and 345, the sixth switches 316, 326, 336, and 346 also select the ground potential GND as the first reference potential. Also in the case of applying the oscillation circuit 2000b as the oscillation circuit, substantially the same advantages can be obtained for substantially the same reason as in the oscillator 2 according to the second embodiment.

4-3. Third Modified Example of Oscillation Circuit

Figure 7:
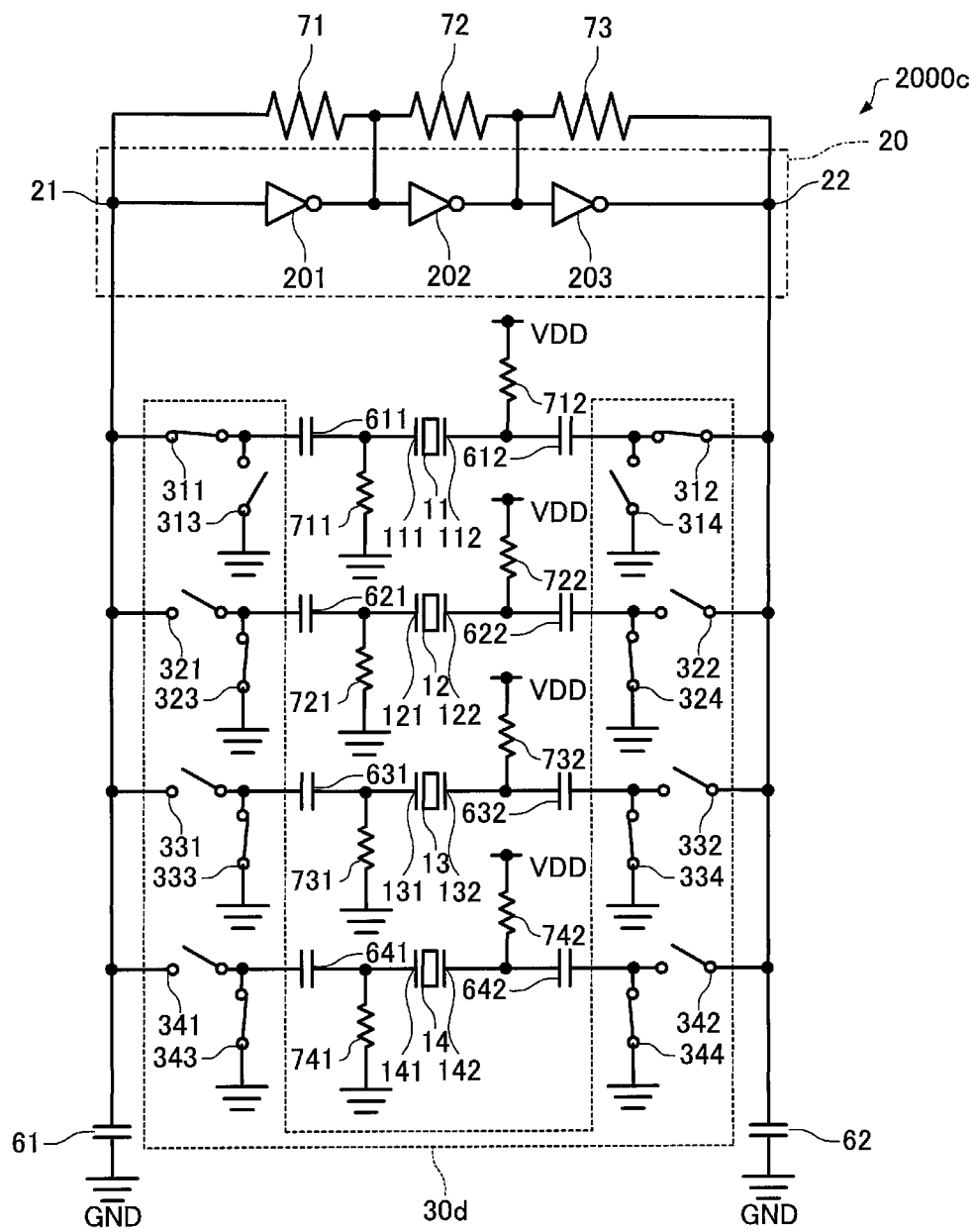
FIG. 7 is a circuit diagram showing an oscillation circuit according to a third modified example of an oscillation circuit applicable to the oscillator and the oscillator.

FIG. 7 is a circuit diagram showing an oscillation circuit 2000c according to a third modified example of the oscillation circuit applicable to the oscillator 2 and the oscillator 3. The oscillation circuit 2000c is different from the oscillation circuit 2000 in the point that the first terminal of the MEMS vibrator connected to the amplifier circuit 20 by the connection circuit 30d is connected to the input terminal 21 of the amplifier circuit 20 via a capacitor, and the second terminal of the MEMS vibrator connected to the amplifier circuit 20 by the connection circuit 30d is connected to the output terminal 22 of the amplifier circuit 20 via a capacitor. In the example shown in FIG. 7, if the MEMS vibrator 11 is connected to the amplifier circuit 20 by the connection circuit 30d, the first terminal 111 of the MEMS vibrator 11 is connected to the input terminal 21 of the amplifier circuit 20 via the capacitor 611, and the second terminal 112 of the MEMS vibrator 11 is connected to the output terminal 21 of the amplifier circuit 20 via the capacitor 612. Similarly, if the MEMS vibrator 12 is connected to the amplifier circuit 20 by the connection circuit 30d, the first terminal 121 of the MEMS vibrator 12 is connected to the input terminal 21 of the amplifier circuit 20 via the capacitor 621, and the second terminal 122 of the MEMS vibrator 12 is connected to the output terminal 21 of the amplifier circuit 20 via the capacitor 622. Further, if the MEMS vibrator 13 is connected to the amplifier circuit 20 by the connection circuit 30d, the first terminal 131 of the MEMS vibrator 13 is connected to the input terminal 21 of the amplifier circuit 20 via the capacitor 631, and the second terminal 132 of the MEMS vibrator 13 is connected to the output terminal 21 of the amplifier circuit 20 via the capacitor 632. Further, if the MEMS vibrator 14 is connected to the amplifier circuit 20 by the connection circuit 30d, the first terminal 141 of the MEMS vibrator 14 is connected to the input terminal 21 of the amplifier circuit 20 via the capacitor 641, and the second terminal 142 of the MEMS vibrator 14 is connected to the output terminal 21 of the amplifier circuit 20 via the capacitor 642.

Therefore, in the example shown in FIG. 7, the first terminal 111 of the MEMS vibrator 11 connected to the amplifier circuit 20 by the connection circuit 30d is connected to the input terminal 21 of the amplifier circuit 20 in an alternating-current manner. Further, in the example shown in FIG. 7, the second terminal 112 of the MEMS vibrator 11 connected to the amplifier circuit 20 by the connection circuit 30d is connected to the output terminal 22 of the amplifier circuit 20 in an alternating-current manner.

Further, in the example shown in FIG. 7, the first terminals of the MEMS vibrators 11 through 14 are connected to the ground potential GND via respective resistors 711, 721, 731, and 741. Further, in the example shown in FIG. 7, the second terminals of the MEMS vibrators 11 through 14 are connected to the power-supply potential VDD as a positive potential via respective resistors 712, 722, 732, and 742.

In the case of using electrostatic MEMS vibrators as the MEMS vibrators 11 through 14, it is required to provide a potential difference between the electrodes constituting the MEMS vibrator. In the example shown in FIG. 7, by supplying the first terminals with a relatively low potential via the resistors 711, 721, 731, and 741, and the second terminals with a relatively high potential via the resistors 712, 722, 732, and 742, a potential difference can be provided between the electrodes constituting each of the MEMS vibrators. Further, since the MEMS vibrator connected to the amplifier circuit 20 by the connection circuit 30d is connected to the amplifier circuit 20 via the capacitors, there is no chance to provide unwanted potential difference between the input terminal 21 and the output terminal 22 of the amplifier circuit 20. Also in the case of applying the oscillation circuit 2000c as the oscillation circuit, substantially the same advantages can be obtained for substantially the same reason as in the oscillator 2 according to the second embodiment. Further, although the oscillation circuit 2000c is an oscillation circuit obtained by applying the configuration including the capacitors 611, 612, 621, 622, 631, 632, 641, and 642, and further the configuration including the resistors 711, 712, 721, 722, 731, 732, 741, and 742 to the oscillation circuit 2000, it is also possible to apply these configurations to the oscillation circuit 1000.

5. Method of Selecting MEMS Vibrator

Figure 8:
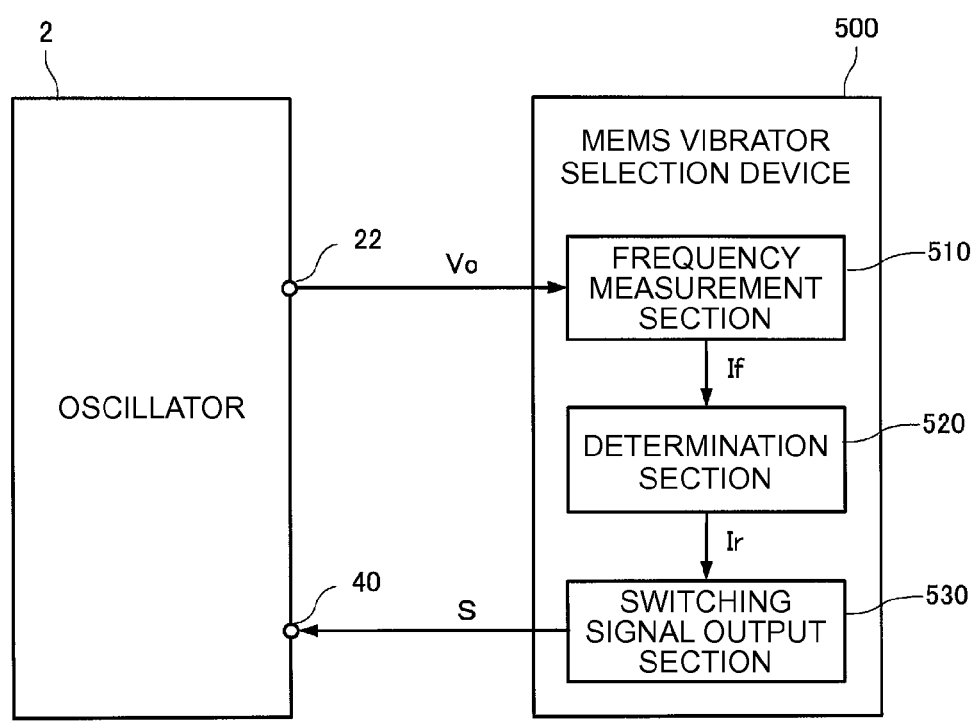
FIG. 8 is a functional block diagram for explaining an example of a method of selecting an MEMS vibrator.

FIG. 8 is a functional block diagram for explaining an example of a method of selecting the MEMS vibrator. In the present section, the case of the oscillator 2 according to the second embodiment will be explained as an example. Further, it is assumed that the state in which neither of the fuses F1 through F4 is cut in the oscillator 2 is an initial state, and that the MEMS vibrator 11 is connected to the amplifier circuit 20 by the connection circuit 30 in the initial state. Further, it is assumed that the design value of the resonant frequency of the MEMS vibrator 11 is f1, the design value of the resonance frequency of the MEMS vibrator 12 is f2, the design value of the resonant frequency of the MEMS vibrator 13 is f3, and the design value of the resonance frequency of the MEMS vibrator 14 is f4, and that the magnitude relation of f2<f1<f3<f4 is fulfilled. It should be noted that in the present embodiment the target frequency as the oscillator is a value equal to f1 which is the design value of the resonant frequency of the MEMS vibrator 11. It is preferable to set the values of the frequencies f1 through f4 to the values close to each other to the extent that the accuracy to the target frequency required as the oscillator is fulfilled by selecting either one of the MEMS vibrators 11 through 14 in consideration of, for example, the variation range of the frequency due to the manufacturing variation in the MEMS vibrators 11 through 14.

An MEMS vibrator selection device 500 is a device for determining the MEMS vibrator to be used for the oscillation operation in the oscillator 2, and then controlling the switching circuit 50a via the signal reception terminal 40 to thereby select the MEMS vibrator. In the example shown in FIG. 8, the MEMS vibrator selection device 500 is configured including a frequency measurement section 510, a determination section 520, and a switching signal output section 530.

The frequency measurement section 510 receives the input of an output signal Vo output from the output terminal 22 of the amplifier circuit 20 of the oscillator 2, and then measures the frequency fo of the output signal Vo. Further, the frequency measurement section 510 outputs frequency information If as the information related to the value of the frequency fo thus measured to the determination section 520. The determination section 520 receives the input of the frequency information If output by the frequency measurement section 510, and then determines which one of the MEMS vibrators should be selected based on the frequency information If.

Further, the determination section 520 outputs determination result information Ir as the information related to the determination result to the switching signal output section 530.

The switching signal output section 530 receives the input of the determination result information Ir output by the determination section 520, and then outputs the switching signal S to the signal reception terminal 40 of the oscillator 2, if necessary, based on the determination result information Ir.

Figure 9:
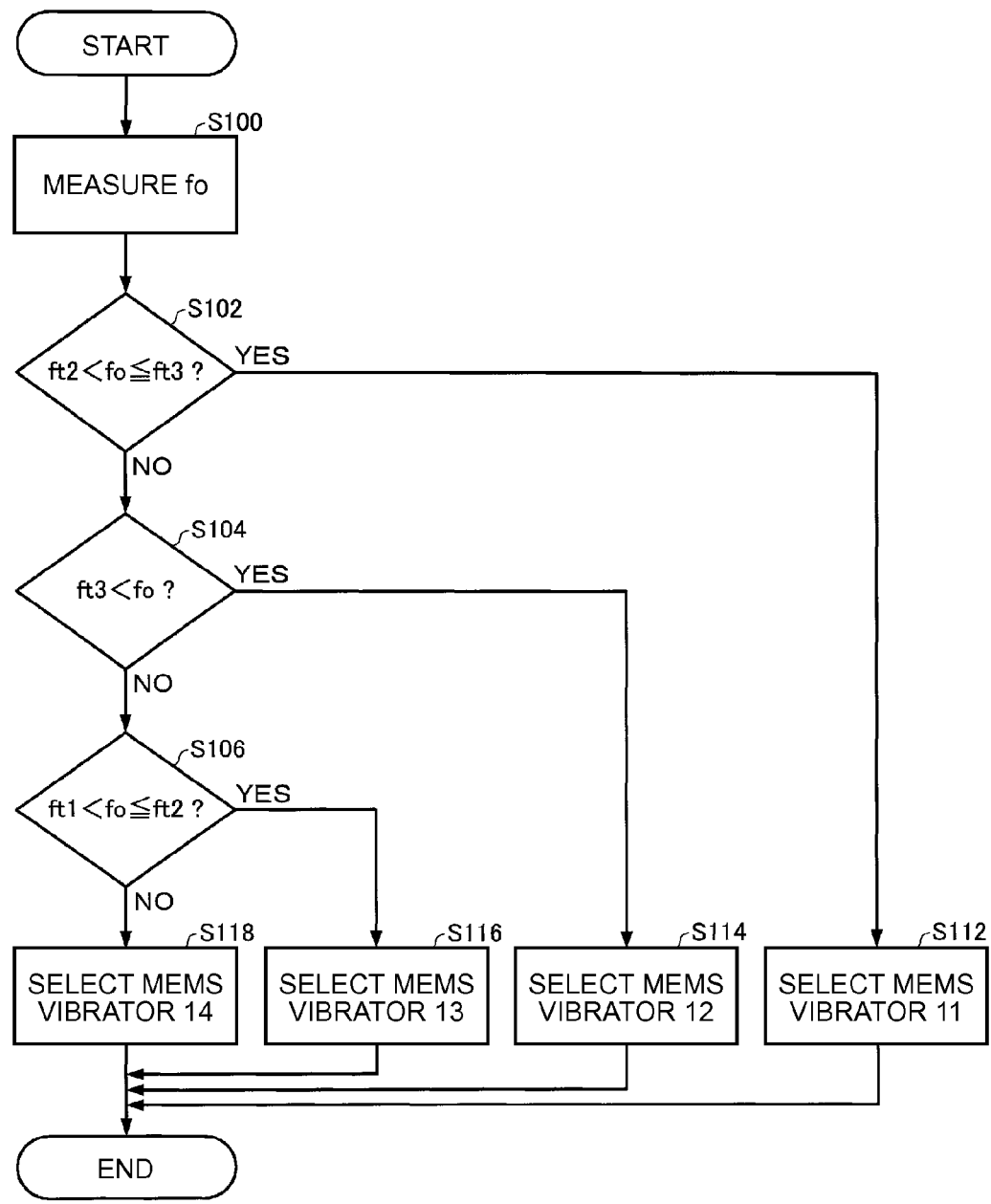
FIG. 9 is a flowchart showing an example of the method of selecting the MEMS vibrator.

FIG. 9 is a flowchart showing an example of the method of selecting the MEMS vibrator. The method of selecting the MEMS vibrator shown in FIG. 9 includes a measurement process for measuring the frequency fo of the output signal Vo of the oscillator 2, a determination process for determining the MEMS vibrator to be selected based on the frequency fo thus measured in the measurement process, and a selection process for controlling the switching circuit 50a of the oscillator 2 based on the result of the determination in the determination process to thereby select the MEMS vibrator.

In the example shown in FIG. 9, it is assumed that threshold frequencies are ft1, ft2, and ft3, and the magnitude relation of ft1<ft2<ft3 is fulfilled. It should be noted that the threshold frequencies ft1, ft2, and ft3 can be set so as to fulfill the magnitude relation of, for example, ft1<f2<ft2<f1<ft3.

In the example shown in FIG. 9, if the magnitude relation of ft2<fo≤ft3 is fulfilled, the MEMS vibrator selection device 500 controls the switching circuit 50a to select the MEMS vibrator 11. Further, if the magnitude relation of ft3<fo is fulfilled, the MEMS vibrator selection device 500 controls the switching circuit 50a to select the MEMS vibrator 12. Further, if the magnitude relation of ft1<fo≤ft2 is fulfilled, the MEMS vibrator selection device 500 controls the switching circuit 50a to select the MEMS vibrator 13. Further, if the magnitude relation of fo≤ft1 is fulfilled, the MEMS vibrator selection device 500 controls the switching circuit 50a to select the MEMS vibrator 14.

In the method of selecting the MEMS vibrator shown in FIG. 9, firstly, the frequency measurement section 510 of the MEMS vibrator selection device 500 receives the output signal Vo output from the output terminal 22 of the amplifier circuit 20 of the oscillator 2, and then measures (step S100, the measurement process) the frequency fo of the output signal Vo. In the present embodiment, after measuring the frequency fo, the frequency measurement section 510 outputs the frequency information If to the determination section 520.

After the measurement process (step S100), the determination section 520 of the MEMS vibrator selection device 500 determines (steps S102 through S106, the determination process) which one of the MEMS vibrators should be selected based on the frequency fo measured in the step S100. In the present embodiment, the determination section 520 determines which one of the MEMS vibrators should be selected based on the frequency information If as the information related to the value of the frequency fo thus measured. Further, the determination section 520 outputs determination result information Ir to the switching signal output section 530. After the determination process (steps S102 through S106), the switching signal output section 530 of the MEMS vibrator selection device 500 outputs the switching signal S based on the result of the determination in the determination process to thereby control the switching circuit 50a of the oscillator 2 to select (steps S112 through S118, the selection process) the MEMS vibrator. In the present embodiment, the switching signal output section 530 controls the switching circuit 50a via the signal reception terminal 40 of the oscillator 2 based on the determination result information Ir output by the determination section 520 to select the MEMS vibrator.

In the example shown in FIG. 9, after the step S100, the determination section 520 determines (step S102) whether or not the magnitude relation of ft2<fo≤ft3 is fulfilled. If the determination section 520 determines that the magnitude relation of ft2<fo≤ft3 is fulfilled (YES in the step S102), the switching signal output section 530 controls the switching circuit 50a to select (step S112) the MEMS vibrator 11. More specifically, the switching signal output section 530 does not output the switching signal S. Thus, the oscillator 2 keeps the initial state to thereby set the state (i.e., the state of selecting the MEMS vibrator 11) in which the MEMS vibrator 11 is connected to the amplifier circuit 20 by the connection circuit 30.

If the determination section 520 determines in the step S102 that the magnitude relation of ft2<fo≤ft3 is not fulfilled (NO in the step S102), the determination section 520 determines (step S104) whether or not the magnitude relation of ft3<fo is fulfilled. If the determination section 520 determines that the magnitude relation of ft3<fo is fulfilled (YES in the step S104), the switching signal output section 530 controls the switching circuit 50a to select (step S114) the MEMS vibrator 12.

More specifically, the switching signal output section 530 applies an electrical current between the terminal 411 and the terminal 412 as the control signal S to thereby cut the fuse F1, and at the same time, applies an electrical current between the terminal 421 and the terminal 422 as the control signal S to thereby cut the fuse F2. Thus, the connection state of the first switches 311 and 321, the second switches 312 and 322, the third switches 313 and 323, and the fourth switches 314 and 324 is switched to thereby set the state (i.e., the state of selecting the MEMS vibrator 12) in which the MEMS vibrator 12 is connected to the amplifier circuit 20 by the connection circuit 30.

If the determination section 520 determines in the step S104 that the magnitude relation of ft3<fo is not fulfilled (NO in the step S104), the determination section 520 determines (step S106) whether or not the magnitude relation of ft1<fo≤ft2 is fulfilled. If the determination section 520 determines that the magnitude relation of ft1<fo≤ft2 is fulfilled (YES in the step S106), the switching signal output section 530 controls the switching circuit 50a to select (step S116) the MEMS vibrator 13.

More specifically, the switching signal output section 530 applies an electrical current between the terminal 411 and the terminal 412 as the control signal S to thereby cut the fuse F1, and at the same time, applies an electrical current between the terminal 431 and the terminal 432 as the control signal S to thereby cut the fuse F3. Thus, the connection state of the first switches 311 and 331, the second switches 312 and 332, the third switches 313 and 333, and the fourth switches 314 and 334 is switched to thereby set the state (i.e., the state of selecting the MEMS vibrator 13) in which the MEMS vibrator 13 is connected to the amplifier circuit 20 by the connection circuit 30.

If the determination section 520 determines in the step S106 that the magnitude relation of ft1<fo≤ft2 is not fulfilled (NO in the step S106), the switching signal output section 530 controls the switching circuit 50a to select (step S118) the MEMS vibrator 14.

More specifically, the switching signal output section 530 applies an electrical current between the terminal 411 and the terminal 412 as the control signal S to thereby cut the fuse F1, and at the same time, applies an electrical current between the terminal 441 and the terminal 442 as the control signal S to thereby cut the fuse F4. Thus, the connection state of the first switches 311 and 341, the second switches 312 and 342, the third switches 313 and 343, and the fourth switches 314 and 344 is switched to thereby set the state (i.e., the state of selecting the MEMS vibrator 14) in which the MEMS vibrator 14 is connected to the amplifier circuit 20 by the connection circuit 30.

After either one of the selection processes (the steps S112 through S118) is terminated, all of the processes of the method of selecting the MEMS vibrator are terminated.

As described above, by determining the MEMS vibrator to be selected based on the frequency fo of the output signal Vo of the oscillator 2 in the initial state and then controlling the switching circuit 50a via the signal reception terminal 40 to thereby select the MEMS vibrator, the MEMS vibrator with which the output signal Vo becomes to have the desired frequency can easily be selected among a plurality of MEMS vibrators. Therefore, there can be realized the oscillator the oscillation frequency of which can be adjusted even after having been encapsulated in the package. Further, the oscillator with a suppressed variation in the oscillation frequency can be realized.

6. Configuration Example of MEMS Vibrators

Figure 10:
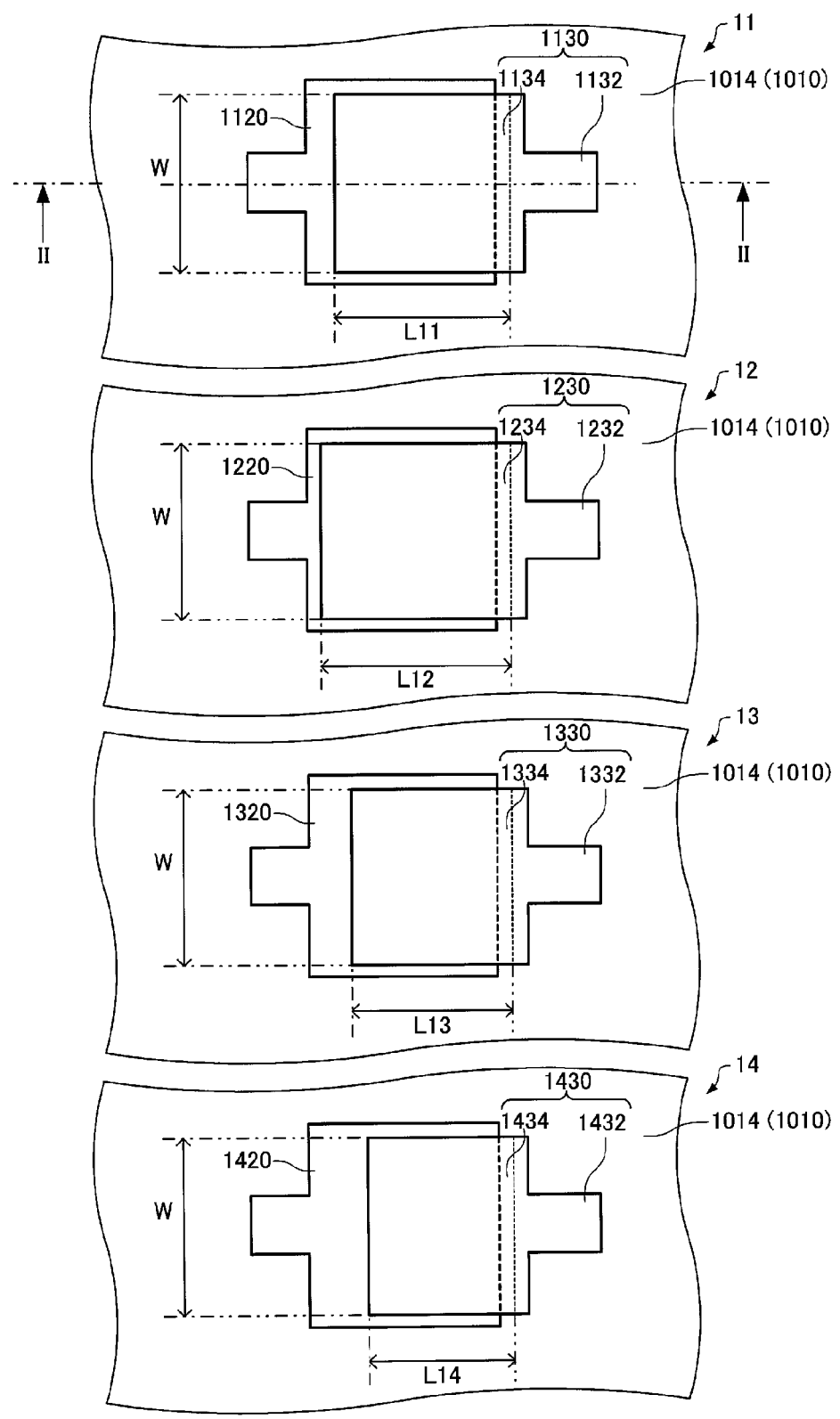
Figure 11:
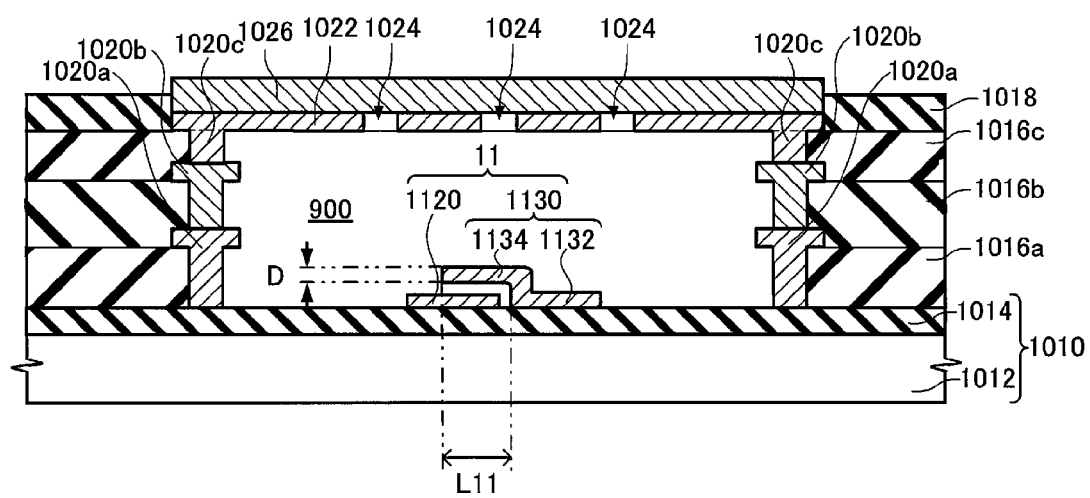
FIG. 11 is a cross-sectional view schematically showing a configuration example of the MEMS vibrator.

FIG. 10 is a plan view schematically showing a configuration example of the MEMS vibrators 11 through 14. FIG. 11 is a cross-sectional view schematically showing the configuration example of the MEMS vibrator 11. It should be noted that in FIG. 10 interlayer insulating layers 1016a, 1016b, and 1016c, a protective film 1018, a first surrounding wall 1020a, a second surrounding wall 1020b, a third surrounding wall 1020c, a first covering layer 1022, and a second covering layer 1026 are omitted from the drawing for the sake of convenience.

It should be noted that in the descriptions according to the present embodiment, in the case of using the term "above" in such a phrase as "a specific object (hereinafter referred to as "B") is formed "above" another specific object (hereinafter referred to as "A")," the term "above" is used intending to include both of the case of forming B directly on A and the case of forming B indirectly on A via another object.

As shown in FIG. 10, the MEMS vibrator 11 is configured including a first electrode 1120 and a second electrode 1130 disposed above a substrate 1010. The MEMS vibrator 12 is configured including a first electrode 1220 and a second electrode 1230 disposed above the substrate 1010. The MEMS vibrator 13 is configured including a first electrode 1320 and a second electrode 1330 disposed above the substrate 1010. The MEMS vibrator 14 is configured including a first electrode 1420 and a second electrode 1430 disposed above the substrate 1010. As shown in FIG. 11, the substrate 1010 can include a support substrate 1012, and an insulating layer 1014.

As the support substrate 1012, a semiconductor substrate such as a silicon substrate can be used. It is also possible to use various substrates such as a ceramic substrate, a glass substrate, a sapphire substrate, a diamond substrate, or a synthetic resin substrate as the support substrate 1012.

The insulating layer 1014 is formed above (more specifically, on the support substrate 1012) the support substrate 1012. As the insulating layer 1014, there can be used, for example, a trench insulating layer, an LOCOS (local oxidation of silicon) insulating layer, and a semi-recess LOCOS insulating layer. Further, the insulating layer 1014 can have a laminate structure composed of a silicon oxide layer and a silicon nitride layer stacked in this order from the support substrate 1012 side. The insulating layer 1014 is capable of electrically isolating the MEMS vibrators 11 through 14 and other elements (not shown) provided to the support substrate 1012 from each other.

The interlayer insulating layers 1016a, 1016b, and 1016c are formed on the insulating layer 1014. The interlayer insulating layers 1016a, 1016b, and 1016c have a cavity 900 in which the MEMS vibrators 11 through 14 are housed. In the example shown in FIG. 11, the cavity 900 is an area zoned with the interlayer insulating layers 1016a, 1016b, and 1016c, and the insulating layer 1014. In the example shown in FIG. 11, the cavity 900 houses the MEMS vibrator 11.

The cavity 900 is provided with surrounding walls (the first surrounding wall 1020a, the second surrounding wall 1020b, and the third surrounding wall 1020c). The first surrounding wall 1020a, the second surrounding wall 1020b, and the third surrounding wall 1020c each have a planar shape of surrounding the MEMS vibrator 11. The planar shape of each of the first surrounding wall 1020a, the second surrounding wall 1020b, and the third surrounding wall 1020c is not particularly limited providing the shape surrounds the MEMS vibrator 11, but can take an arbitrary shape such as a circular shape or a polygonal shape. The first surrounding wall 1020a, the second surrounding wall 1020b, and the third surrounding wall 1020c are electrically connected to each other, and constitute an integrated sidewall surrounding the MEMS vibrator 11. As the material of the first surrounding wall 1020a, the second surrounding wall 1020b, and the third surrounding wall 1020c, there can be cited, for example, polycrystalline silicon, metal such as aluminum, copper, tungsten, or titanium, and alloys of any of these metals.

The first covering layer 1022 is formed above the cavity 900. The first covering layer 1022 is provided with through holes 1024. The number of through holes 1024 is not particularly limited. The first covering layer 1022 is formed integrally with the third surrounding wall 1020c in the example shown in the drawing. The first covering layer 1022 covers above the cavity 900. The first covering layer 1022 has a laminate structure having, for example, a titanium layer, a titanium nitride layer, an aluminum-copper alloy layer, and a titanium nitride layer stacked in this order. The film thickness of the first covering layer 1022 is, for example, about several hundreds of nanometers.

The first surrounding wall 1020a, the second surrounding wall 1020b, the third surrounding wall 1020c, and the first covering layer 1022 are preferably provided with a constant electrical potential (e.g., the ground potential). Thus, it is possible to make the first surrounding wall 1020a, the second surrounding wall 1020b, the third surrounding wall 1020c, and the first covering layer 1022 function as an electromagnetic shield. In other words, it is possible to electromagnetically shield the MEMS vibrator 11 to some extent with respect to the outside.

The second covering layer 1026 is formed on the first covering layer 1022. The second covering layer 1026 blocks the through holes 1024 of the first covering layer 1022. As the material of the second covering layer 1026, there can be cited metal such as aluminum, titanium, or tungsten. The film thickness of the second covering layer 1026 is, for example, about 3 μm. The first covering layer 1022 and the second covering layer 1026 can function as a sealing member for covering the cavity 900 from above to seal the cavity 900.

The MEMS vibrators 11 through 14 are housed inside the cavity 900. Further, the signal reception terminal 40 (not shown in FIGS. 10 and 11) is disposed outside the cavity 900.

Since the basic configurations of the MEMS vibrators 11 through 14 are substantially the same, in the explanation described below, the explanation will be presented with a focus on the constituents of the MEMS vibrator 11, and the reference numerals corresponding to the constituents of the MEMS vibrators 12 through 14 are sequentially described in the parentheses.

The first electrode 1120 (1220, 1320, 1420) of the MEMS vibrator 11 (12, 13, 14) is formed on the substrate 1010. The shape of the first electrode 1120 (1220, 1320, 1420) is, for example, a layer or a thin-film.

The second electrode 1130 (1230, 1330, 1430) of the MEMS vibrator 11 (12, 13, 14) is formed having an interval with the first electrode 1120 (1220, 1320, 1420). The second electrode 1130 (1230, 1330, 1430) has a support section 1132 (1232, 1332, 1432) formed on the substrate 10 and a beam section 1134 (1234, 1334, 1434) supported by the support section 1132 (1232, 1332, 1432) and disposed above the first electrode 1120 (1220, 1320, 1420). The support section 1132 (1232, 1332, 1432) is disposed so as to be opposed to the first electrode 1120 (1220, 1320, 1420) with a space. The second electrode 1130 (1230, 1330, 1430) is formed to have a cantilever shape.

When a voltage is applied between the first electrode 1120 (1220, 1320, 1420) and the second electrode 1130 (1230, 1330, 1430), the beam section 1134 (1234, 1334, 1434) can vibrate due to the electrostatic force generated between the electrodes 1120 (1220, 1320, 1420) and 1130 (1230, 1330, 1430). In other words, the MEMS vibrators 11 through 14 shown in FIGS. 10 and 11 are each an electrostatic MEMS vibrator.

As the material of the first electrode 1120 (1220, 1320, 1420) and the second electrode 1130 (1230, 1330, 1430), there can be cited, for example, polycrystalline silicon provided with electrical conductivity by doping predetermined impurities. The MEMS vibrators 11 through 14 can be configured so that the respective beam sections 1134, 1234, 1334, and 1434 have the same thickness D. Further, the MEMS vibrators 11 through 14 can be configured so that the respective beam sections 1134, 1234, 1334, and 1434 have the same width W. According to these configurations, it is possible to control the resonant frequencies of the MEMS vibrators 11 through 14 with the lengths L11, L12, L13, and L14 of the beam sections 1134, 1234, 1334, and 1434, respectively.

The longer the lengths L11, L12, L13, and L14 of the beam sections 1134, 1234, 1334, and 1434 are, the lower the resonant frequency of the MEMS vibrators 11 through 14 become, and the shorter the lengths L11, L12, L13, and L14 of the beam sections 1134, 1234, 1334, and 1434 are, the higher the resonant frequency of the MEMS vibrators 11 through 14 become. As shown in FIG. 10, in the present embodiment, the beam sections 1134, 1234, 1334, and 1434 are configured so that the magnitude relation of L14<L13<L11<L12 is fulfilled. Therefore, the resonant frequencies f1 through f4 of the MEMS vibrators 11 through 14 fulfill the magnitude relation of f2<f1<f3<f4.

As shown in FIG. 10, the MEMS vibrators 11 through 14 are formed on the same substrate 1010. Further, the MEMS vibrators 11 through 14 can be formed on the same substrate 1010 in the same manufacturing process. Thus, the direction (the tendency of becoming greater or smaller than the design value) in which the resonant frequency between the MEMS vibrators 11 through 14 due to variations in manufacturing shifts normally becomes the same, and therefore, the magnitude relation between the resonant frequencies of the MEMS vibrators 11 through 14 is maintained. Therefore, it is possible to more surely select the MEMS vibrator with the resonant frequency closer to the target frequency of the oscillation circuit.

The inside of the cavity 900 can also be in a reduced-pressure state. If the inside of the cavity 900 is in a reduced-pressure state, the MEMS vibrators 11 through 14 are easier to vibrate compared to the case of an atmospheric-pressure state. Thus, in some cases, the frequency output by the oscillation circuit is different between the case in which the MEMS vibrators 11 through 14 are in the reduced-pressure state and the case in which the MEMS vibrators 11 through 14 are in the atmospheric-pressure state. According to the oscillators 1 through 3 related to the embodiments described above, the oscillation frequency can be adjusted even after the MEMS vibrators 11 through 14 have been housed in the inside of the cavity 900 in the reduced-pressure state. Therefore, a more appropriate one of the MEMS vibrators can be selected. It should be noted that as the MEMS vibrators 11 through 14, various MEMS vibrators known to the public can be adopted besides the configuration described above.

It should be noted that the embodiments and the modified examples described above are each nothing more than an example, and the invention is not limited thereto. For example, it is possible to arbitrarily combine the embodiments and the modified examples described above.

The invention is not limited to the embodiments described above, but further various modifications are possible. For example, the invention includes configurations (e.g., configurations having the same function, the same way, and the same result, or configurations having the same object and the same advantage) substantially the same as those described in the embodiment section. Further, the invention includes configurations obtained by replacing a non-essential part of the configurations described in the embodiment section. Further, the invention includes configurations providing the same functions and the same advantages or configurations capable of achieving the same object as the configurations described in the embodiment section. Further, the invention includes configurations obtained by adding technologies known to the public to the configurations described in the embodiment section.

The entire disclosure of Japanese Patent Application No. 2011-088915, filed Apr. 13, 2011 is expressly incorporated by reference herein.

What is claimed is:

1. An oscillator comprising:
a plurality of MEMS vibrators each having a first terminal and a second terminal, and having respective resonant frequencies different from each other;
an amplifier circuit having an input terminal and an output terminal;
a connection circuit adapted to connect the first terminal of one of the MEMS vibrators and the input terminal to each other, and the second terminal of the one of the MEMS vibrators and the output terminal to each other to thereby connect the one of the MEMS vibrators and the amplifier circuit to each other;
a signal reception terminal adapted to receive a switching signal used to switch a state of the connection circuit; and
a switching circuit adapted to make the connection circuit switch the MEMS vibrator to be connected to the amplifier circuit based on the switching signal,
wherein the MEMS vibrators are housed in an inside of a cavity,
the signal reception terminal is disposed outside the cavity, and
the connection circuit connects the first terminal and the second terminal of the MEMS vibrator, which fails to be connected to the amplifier circuit, to a first reference potential.

2. The oscillator according to claim 1, wherein
the connection circuit includes at least one of
a first switch adapted to switch a connection state between the first terminal of the MEMS vibrator and the input terminal and
a second switch adapted to switch a connection state between the second terminal of the MEMS vibrator and the output terminal.

3. The oscillator according to claim 2, wherein
the connection circuit includes the first switch and the second switch.

4. The oscillator according to claim 1, wherein
the connection circuit includes
a third switch adapted to switch a connection state between the first terminal of the MEMS vibrator, which fails to be connected to the amplifier circuit, and the first reference potential, and
a fourth switch adapted to switch a connection state between the second terminal of the MEMS vibrator, which fails to be connected to the amplifier circuit, and the first reference potential.

5. The oscillator according to claim 1, further comprising:
a first capacitor connected between the input terminal and a second reference potential; and
a second capacitor connected between the output terminal and the second reference potential.

6. The oscillator according to claim 1, wherein
the inside of the cavity is in a reduced-pressure state.

* * * * *